(12) United States Patent
Park

(10) Patent No.: US 6,998,873 B2
(45) Date of Patent: Feb. 14, 2006

(54) DATA INPUT/OUTPUT BUFFER AND SEMICONDUCTOR MEMORY DEVICE USING THE SAME

(75) Inventor: Jin Su Park, Daegu-si (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 67 days.

(21) Appl. No.: 10/743,934

(22) Filed: Dec. 23, 2003

(65) Prior Publication Data

US 2005/0104625 A1    May 19, 2005

(30) Foreign Application Priority Data

Nov. 19, 2003   (KR) ...................... 10-2003-0081959

(51) Int. Cl.
   *H03K 19/0175*   (2006.01)
(52) U.S. Cl. .......................... 326/83; 326/82; 326/112; 326/119
(58) Field of Classification Search ............ 326/82–83, 326/86, 90, 112, 119, 121; 365/189.07, 189.05; 327/108, 112
See application file for complete search history.

(56) References Cited

U.S. PATENT DOCUMENTS

| 6,542,011 B2 * | 4/2003 | Onishi ........................ 327/108 |
| 6,650,168 B1 * | 11/2003 | Wang et al. ................. 327/333 |
| 6,842,377 B2 * | 1/2005 | Takano et al. ......... 365/185.21 |

* cited by examiner

*Primary Examiner*—Anh Q. Tran
(74) *Attorney, Agent, or Firm*—Marshall, Gerstein & Borun LLP

(57) ABSTRACT

Provided is a data input/output buffer and a semiconductor memory device using the same. A transistor of a switching means or a logical element out of devices constituting a data input/output buffer, to which a data signal is inputted most rapidly, is implemented using a low voltage-driven device whose threshold voltage is low. It is therefore possible to improve reliability of a circuit by exactly determining the level of a data signal even if the data signal is inputted as a level that is lowered as much as a threshold voltage.

3 Claims, 2 Drawing Sheets

DATA INPUT/OUTPUT BUFFER AND SEMICONDUCTOR MEMORY DEVICE USING THE SAME

BACKGROUND

1. Technical Field

A data input/output buffer that can exactly sense an input signal even if the signal is inputted as a low voltage due to a drop in a threshold voltage, and a semiconductor memory device using the same are disclosed.

2. Discussion of Related Art

A semiconductor device is provided with a buffer for retaining a given inputted signal even if the input of the signal is stopped after the signal is inputted. Of these buffers, there is a page buffer or a data output buffer that is used for an NAND type flash memory device.

In an NAND type flash memory device constructed in a string unit, data stored at cells are buffered in the page buffer upon a read operation. Furthermore, data stored at a page buffer of a number of page buffers, which is selected by a column multiplexer, are transferred to a data line via the data output buffer.

As such, the buffer functions to temporarily retain the data signal. At this time, there is no problem when the data signal is inputted as a Low level, but there may be a problem when the data signal is inputted as a High level. For example, if the data signal passes through a switching element such as a logical element or a transistor, a voltage of the data signal is lowered as much as a threshold voltage. If the voltage of the data signal is lowered as such, the transfer rate of the signal is lowered. Due to this, not only the operating speed of the circuit is lowered, but also the buffer cannot exactly sense whether the data signal is a High level or a Low level. This causes a serious problem that the circuit operates at low voltage.

SUMMARY OF THE DISCLOSURE

A data input/output buffer and a semiconductor memory device using the same are disclosed, which can improve reliability of a circuit by exactly determining the level of a data signal even if the data signal is inputted as a level that is lowered as much as a threshold voltage, in such a manner that a transistor of a switching means or a logical element out of devices constituting the data input/output buffer, to which the data signal is inputted most rapidly is implemented using a low voltage-driven device whose threshold voltage is low.

According to one embodiment, there is provided a data input/output buffer, including a plurality of switching elements and logical elements, wherein an NMOS transistor of a switching element driven according to a data signal inputted from a peripheral circuit or a logical element to which the data signal is inputted, of the plurality of the switching elements or the plurality of the logical elements, is a low voltage-driven NMOS transistor.

According to another embodiment, there is provided a data input/output buffer, including a first logical element driven according to a data signal inputted from a peripheral circuit, the first logical element having a PMOS transistor and a low voltage-driven NMOS transistor; and a second logical element for latching an output signal of the first logical element.

Here, the switching element or the NMOS transistor may be replaced with an NMOS transistor whose threshold voltage is 0V. In this case, a switching element that is turned on according to an output enable signal only when a data is outputted, may be further provided between the low voltage-driven NMOS transistor and a ground voltage terminal. At this time, the switching element can be implemented using an NMOS transistor.

According to one embodiment, there is provided a semiconductor memory device, including a memory cell array; a row decoder for selecting a given page of the memory cell array according to a row address signal; a page buffer for storing data stored at the page selected by the row decoder; a colunm decoder for generating a bit line select signal according to a column address signal; a column multiplexer for selecting any one of the data stored at the page buffer according to the bit line select. signal; and a data input/output buffer for storing the data selected by the column multiplexer and transferring the data to a data line, wherein a device driven by the data is a low voltage-driven NMOS transistor.

In the above, an NMOS transistor whose threshold voltage is 0V may be used as the low voltage-driven NMOS transistor. In this case, a switching element that is turned on only when a data is outputted, may be further provided between the low voltage-driven NMOS transistor and a ground voltage terminal. At this time, the switching element may be implemented using an NMOS transistor.

Meanwhile, the data input/output buffer includes a PMOS transistor driven according to the data signal outputted from the column multiplexer and connected to a power supply voltage terminal; a low voltage-driven NMOS transistor driven according to the data signal outputted from the column multiplexer and connected to the PMOS transistor; a switching element connected between the low voltage-driven NMOS transistor and a ground voltage terminal, wherein the switching element is turned on only in a data output period; and a latch unit for inverting a signal received via the PMOS transistor or the low voltage-driven NMOS transistor.

DETAILED DESCRIPTION OF PREFERRED EMBODIMENTS

Now, the preferred embodiments will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

The construction and operation of a data input/output buffer and a semiconductor memory device using the same according to embodiments of the present invention will now be described in detail taking an NAND type flash memory device as an example.

Figure 1:
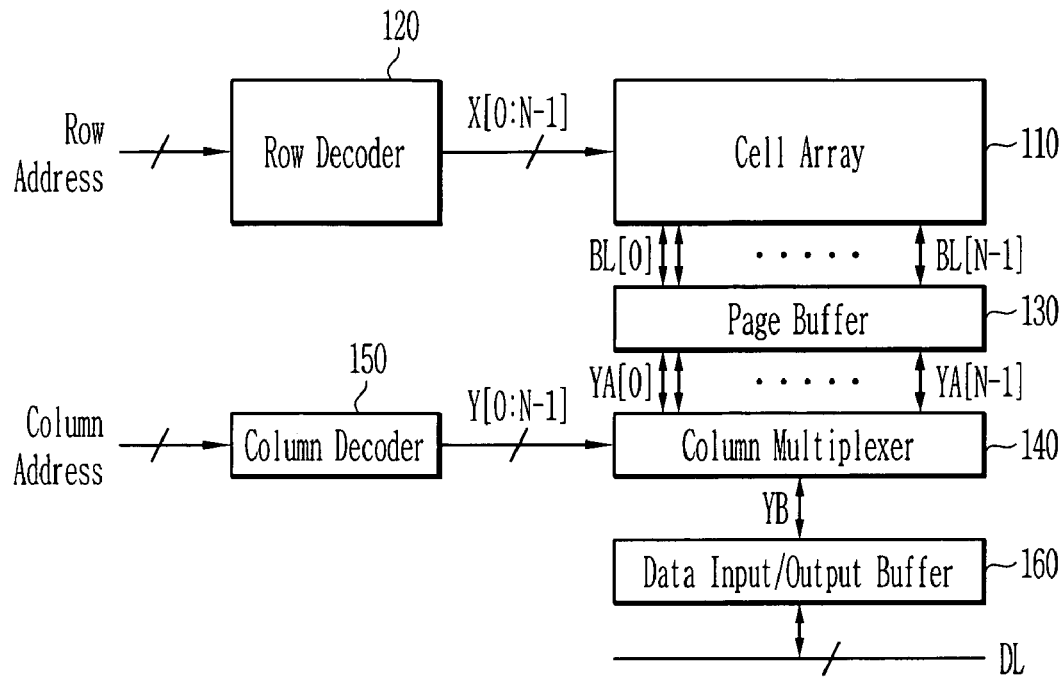
FIG. 1 is a block diagram illustrating the construction and the operation of a semiconductor memory device using a data input/output buffer according to an embodiment.
Figure 2:
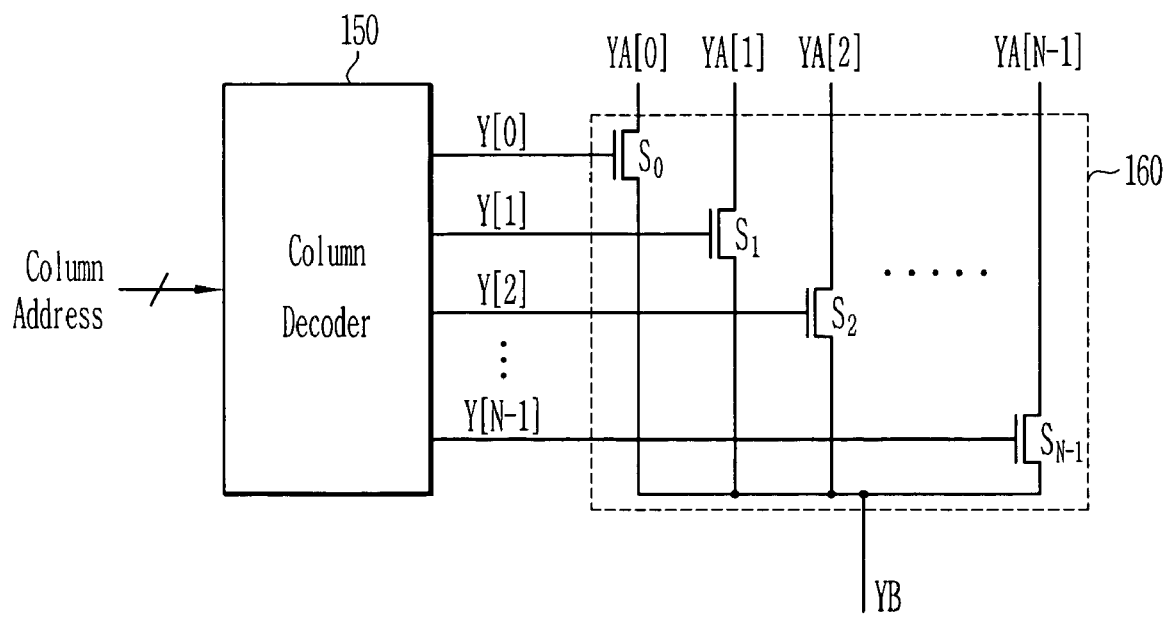
FIG. 2 is a circuit diagram illustrating the construction of the column multiplexer shown in FIG. 1.
Figure 3:
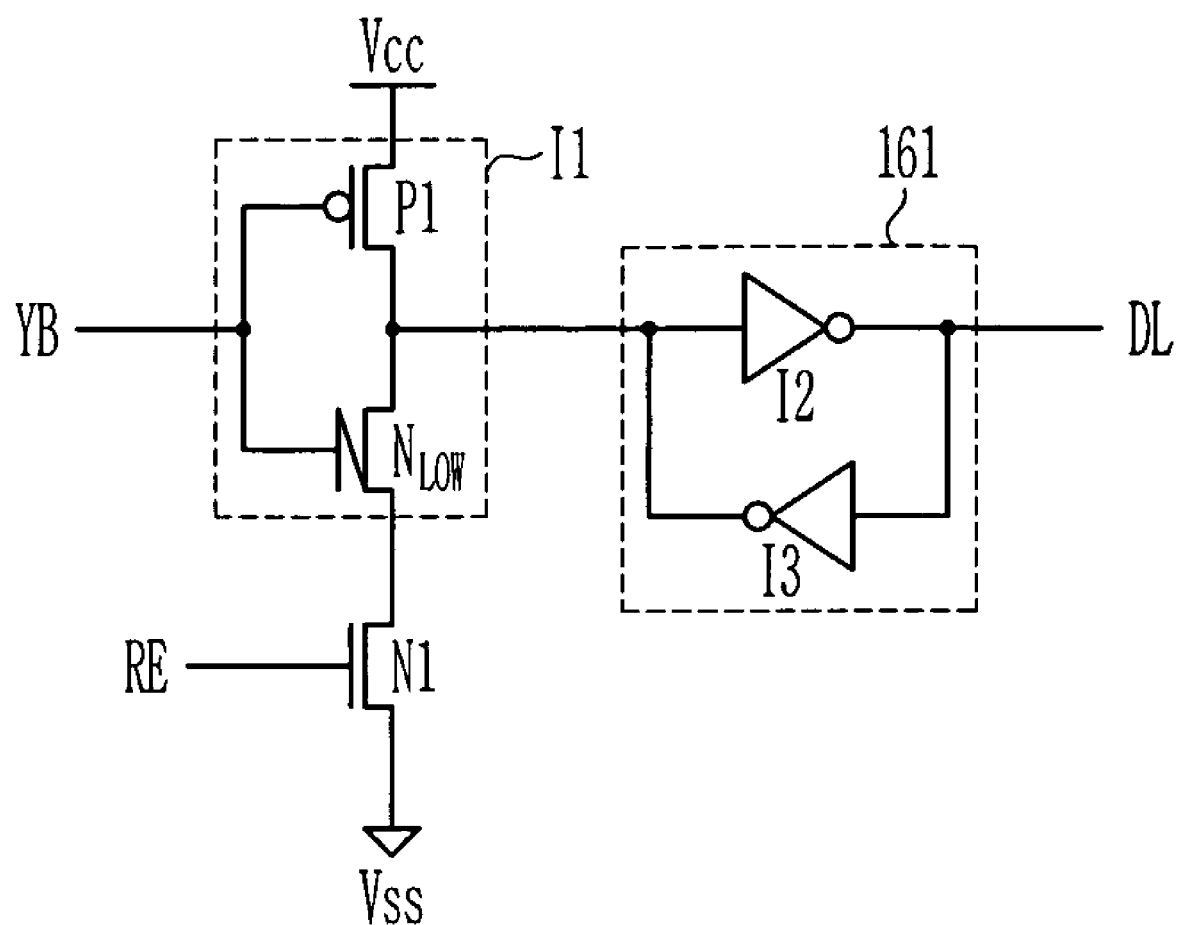
FIG. 3 is a circuit diagram illustrating the construction of the data input/output buffer shown in FIG. 1.

FIG. 1 is a block diagram illustrating the construction of a semiconductor memory device using a data input/output buffer according to an embodiment of the present invention. FIG. 2 is a circuit diagram illustrating the construction of the column multiplexer shown in FIG. 1. FIG. 3 is a circuit diagram illustrating the construction of the data input/output buffer shown in FIG. 1.

Referring to FIG. 1, the NAND type flash memory device includes a cell array 110, a row decoder 120, a page buffer 130, a column multiplexer 140, a column decoder 150 and a data input/output buffer 160.

Here, the cell array 110 of the NAND type flash memory device consists of a plurality of memory cells (not shown) connected between a number of word lines (hereinafter, referred to as 'page') and a number of bit line pairs, respectively. The row decoder 120 decodes row addresses of externally inputted address signals to generate page select signals X[0:N−1] for selecting specific pages. The page buffer 130 stores data that are stored at a page selected by the row decoder 120 and received via bit lines BL[0:N−1]. The column decoder 150 decodes column addresses of the address signals to generate bit line select signals Y[0:N−1].

Referring to FIG. 1 and FIG. 2, the column multiplexer 140 outputs data YB that are selected according to the bit line select signals Y[0:N−1] generated from the column decoder 150, of data YA[0:N−1] outputted from the page buffer 130. The column multiplexer 140 may be implemented using a number of switching elements S0 to Sn−1, each of which is connected to an output terminal of the page buffer 130 and is operated according to each of the bit line select signals Y[0:N−1]. Only one of the switching elements S0 to Sn−1 is turned on according to the bit line select signals Y[0:N−1]. Therefore, only one of the data YA[0:N−1] outputted from the page buffer 130 is outputted.

Referring to FIG. 1 and FIG. 3, the data input/output buffer 160 stores the data YB outputted from the column multiplexer 140 and transfers the data to a data line DL. Such a column multiplexer 140 includes a first inverter I1 to which the data YB is inputted and a latch 161. The latch 161 has a second inverter I2 and a third inverter I3, which are connected in a chain structure. The latch 161 inverts the output signal of the first inverter I1 and then latches the output signal.

Meanwhile, in the course that the data YB is transferred from the page buffer 130 to the data input/output buffer 160 via the column multiplexer 140, the data YB is inputted as a level that is lowered as much as a threshold voltage of a switching element included in the column multiplexer 140 by means of the switching element. In this case, it is not problematic if the data YB is inputted as a Low level. If the data YB is inputted as a High level, however, the data is not inputted as a normal level, but as a level that is lowered as much as the threshold voltage. For this reason, the data output buffer 160 might misjudge the data YB of the High level as a Low level. In this case, this may be further severe than when the circuit is operated at low voltage in order to reduce power consumption.

In order to prevent this problem, in order for the data output buffer 160 to exactly judge the level of the data YB even if the data YB is inputted as a level that is lower by a threshold voltage than a normal level, an NMOS transistor included in the switching element or the logical element, which is directly driven by the data YB, is replaced with a low voltage transistor.

For example, as shown in FIG. 3, if the data signal YB is directly inputted to the first inverter I1, an NMOS transistor included in the first inverter I1 is replaced with a low voltage NMOS transistor $N_{LOW}$. Or, the NMOS transistor included in the first inverter I1 may be substituted by an NMOS transistor whose threshold voltage is 0V. If the NMOS transistor is replaced with the low voltage NMOS transistor $N_{LOW}$ as such, the low voltage NMOS transistor $N_{LOW}$ normally operates even if the data signal YB is inputted as a High level that is lowered by a threshold voltage than the normal High level. If the low voltage NMOS transistor $N_{LOW}$ of the first inverter I1 normally operates, the latch 161 inverts the ground voltage Vss inputted through the low voltage NMOS transistor $N_{LOW}$ and then transfers a signal of a High level to the data line DL.

Meanwhile, if the data signal YB is inputted as a Low level, the low voltage NMOS transistor $N_{LOW}$ is turned off and a PMOS transistor P1 operates. The latch 161 inverts the power supply voltage Vcc inputted through the PMOS transistor P1 and then transfers a signal of a Low level to the data line DL.

As above, if the NMOS transistor included in the first inverter I1 is replaced with the low voltage NMOS transistor $N_{LOW}$ or the NMOS transistor $N_{LOW}$ whose threshold voltage is 0V, the PMOS transistor P1 and the NMOS transistor $N_{LOW}$ of the first inverter I1 are almost simultaneously turned on when the data signal YB is inputted as a Low level, which may increase power consumption. Accordingly, in order to prevent this, a switching element N1 may be disposed between the NMOS transistor $N_{LOW}$ and the ground voltage Vss and only the switching element N1 may be turned on in a period where the data signal YB is inputted. In this case, a read enable signal RE generating within a memory device after an address signal is inputted may be used as a signal for controlling on/off of the switching element N1. As such, all the memory devices or circuits generate a data output signal such as an enable signal in order to output data. If on/off of the switching element N1 is controlled so that a current path is cut off when the data are not outputted as such a signal, it is possible to prevent an increase in power consumption even if the NMOS transistor $N_{LOW}$ of the first inverter I1 is replaced with the low voltage NMOS transistor or the NMOS transistor whose threshold voltage is 0V.

According to the present invention described above, a transistor of a switching means or a logical element of devices constituting a data input/output buffer, to which a data signal is inputted most rapidly, is implemented using a low voltage-driven device whose threshold voltage is low. Therefore, the present invention has an effect that it can improve reliability of a circuit by exactly determining the level of a data signal even if the data signal is inputted as a level that is lowered as much as a threshold voltage.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A data input/output buffer comprising:
   a PMOS transistor driven according to the data signal which is directly inputted to the PMOS transistor from a peripheral circuit and connected to a power supply voltage terminal;
   a low voltage-driven NMOS transistor driven according to the data signal which is directly inputted to the low voltage-driven NMOS transistor from the peripheral circuit and connected to the PMOS transistor, wherein the low voltage-driven NMOS transistor having a threshold voltage of 0V;
   a NMOS transistor connected between the low voltage-driven NMOS transistor and a ground voltage terminal, wherein the NMOS transistor is turned on according to an output enable signal; and a latch unit for inverting and restoring a signal received via the PMOS transistor or the low voltage-driven NMOS transistor.

2. A data input/output buffer comprising:

a first logical element driven according to a data signal directly inputted to the first logical element from a peripheral circuit, the first logical element having a PMOS transistor and a low voltage-driven NMOS transistor;

a second logical element for inverting and restoring a signal received via the PMOS transistor or the low voltage-driven NMOS transistor; and a NMOS transistor that is connected between the low voltage-driven NMOS transistor and a ground voltage terminal with the switching element being turned on according to an output enable signal, wherein the low voltage-driven NMOS transistor having a threshold voltage of 0V.

3. A semiconductor memory device, comprising:

a memory cell array;

a row decoder for selecting a given page of the memory cell array according to a row address signal;

a page buffer for storing data stored at the page selected by the row decoder;

a column decoder for generating a bit line select signal according to a column address signal;

a column multiplexer for selecting and outputting any one of the data stored at the page buffer according to the bit line select signal; and a data input/output buffer for storing the data selected by the column multiplexer and transferring the data to a data line, wherein the data input/output buffer comprises a PMOS transistor driven according to the data signal directly inputted to the PMOS transistor from the column multiplexer and connected to a power supply voltage terminal;

a low voltage-driven NMOS transistor driven according to the data signal directly inputted to the low voltage-driven NMOS transistor from the column multiplexer and connected to the PMOS transistor, wherein the low voltage-driven NMOS transistor having a threshold voltage of 0V;

a NMOS transistor connected between the low voltage-driven NMOS transistor and a ground voltage terminal, wherein the NMOS transistor is turned on according to an output enable signal; and a latch unit for inverting and restoring a signal received via the PMOS transistor or the low voltage-driven NMOS transistor.

* * * * *